United States Patent [19]

Dolazza et al.

[11] Patent Number: 4,569,028
[45] Date of Patent: Feb. 4, 1986

[54] ADAPTIVE DIGITIZER CIRCUIT FOR INFORMATION PROCESSING SYSTEM

[75] Inventors: Enrico Dolazza, Boston; Bernard M. Gordon, Gloucester; Hans J. Weedon, Salem, all of Mass.

[73] Assignee: Analogic Corporation, Wakefield, Mass.

[21] Appl. No.: 507,472

[22] Filed: Jun. 24, 1983

[51] Int. Cl.⁴ .............................................. G06F 15/31
[52] U.S. Cl. .................................... 364/574; 364/572; 340/347 AD
[58] Field of Search ............... 364/574, 554, 550, 527, 364/525, 521, 572, 553; 340/347 AD; 367/520, 521; 375/1, 58

[56] References Cited

U.S. PATENT DOCUMENTS

| | | | |
|---|---|---|---|
| 3,732,410 | 5/1973 | Mackechnie | 364/825 X |
| 4,220,923 | 9/1980 | Pelchat et al. | 375/58 X |
| 4,242,732 | 12/1980 | Campbell | 364/572 X |
| 4,308,098 | 12/1981 | Neüner et al. | 364/574 X |
| 4,322,641 | 3/1982 | Packard | 364/574 X |
| 4,395,732 | 7/1983 | Upton | 340/347 AD X |
| 4,412,341 | 10/1983 | Gersho et al. | 364/574 X |
| 4,458,328 | 7/1984 | Kino et al. | 364/825 |
| 4,482,957 | 11/1984 | Bjokholm | 364/554 X |
| 4,493,091 | 1/1985 | Gundry | 340/347 AD X |

Primary Examiner—Edward J. Wise
Attorney, Agent, or Firm—Joseph S. Iandiorio; William E. Noonan

[57] ABSTRACT

An adaptive digitizer circuit for an information processing system includes an entropy filter responsive to an information signal V having a variable noise $\sigma_V$ that is a function of V, for providing a transform signal T, having a constant transform noise level $\sigma_T$ throughout its dynamic range; and an analog to digital converter in which the ratio $\sigma_T/\delta_T$ of the noise level $\sigma_T$ of the transformed signal and the digitization interval $\delta_T$ is constant throughout the dynamic range of T.

12 Claims, 7 Drawing Figures

ADAPTIVE DIGITIZER CIRCUIT FOR INFORMATION PROCESSING SYSTEM

FIELD OF THE INVENTION

This invention relates to an adaptive digitizer circuit for an information processing system, and more particularly to such an adaptive digitizer circuit which provides a constant ratio between the RMS noise of the analog input signal and the RMS digitization error throughout the range of the processed signal. This is obtained by adapting the local digitization interval to be proportional to the local RMS noise of the analog signal.

BACKGROUND OF INVENTION

Digitization of signals is a problem in information systems where the noise level may vary across the dynamic range of the information signal. For example, in X-ray imaging devices there is an inherent noise associated with the statistical uncertainty of the X-ray photon emissions and absorption which increases with increasing number of photons finally detected. Typically, after passing through a body to be imaged the X-rays are detected by an image intensifier, which converts the X-ray pattern into a visible image that is scanned by a video camera whose output is used for further processing of the image information. This video camera introduces into the system additional electronic noise which is approximately constant over the range of the image signal. The combined noise, the photon noise and the electronic noise, is therefore variable over the operating range of the system and can be considered as the inherent noise associated with the analog signal to be digitized. The various noise factors are typically expressed in terms of the standard deviation.

The digitization process intrinsically adds an error, the RMS value of which is proportional to the width of the digitization (quantization) interval. This error can be dealt with as a digitization noise, which furthermore combines with the inherent noise of the analog signal. To preserve the information content of the signal throughout its full dynamic range, the overall noise of the digitized signal should not exceed the inherent analog signal noise by more than a few percent. In other terms, because of the variable nature of the noise, the digitization interval must be related to the noise in that smaller intervals are required with smaller inherent noise signals and larger intervals with larger inherent noise signals. Thus the digitizing interval must be made sufficiently small to properly code the signals with reference to its minimum inherent noise. This results in the over coding of the signal where it carries higher inherent noise whenever no provision is made to adapt the digitization interval. This is inefficient and adds entropy to the digitized data in excess of the information content of the signal. For example, a sufficiently small digitization interval to satisfactorily code an X-ray video signal throughout its full dynamic range may require as much as a twelve bit analog to digital converter. Further, the subsequent processing equipment will require storing of at least twelve bit words. In addition, the additional entropy of the digitized data adversely affects the data compression obtainable.

SUMMARY OF INVENTION

It is therefore an object of this invention to provide an improved, inexpensive and extremely simple adaptive digitizer circuit for an information processing system which provides a constant ratio between the digitization noise and the inherent signal noise over the range of the information signal.

It is a further object of this invention to minimize the number of bits required to properly code the information content of the signal.

It is a further object of this invention to provide such an adaptive digitizer circuit which equalizes the entropy of the digitized codes to their intrinsic information content, thus allowing the maximum level of data compression obtainable.

It is a further object of this invention to provide such an adaptive digitizer circuit which applies a transform function providing an approximately constant noise level at its output over the dynamic range of the information signal.

This invention results from the realization that an improved, highly effective adaptive digitizer circuit can be made which utilizes an entropy filter having a variable noise input signal that is a function of an information signal itself for providing a transformed signal having a constant transformed noise level throughout its dynamic range, and an analog to digital converter in which the ratio of the noise level of the transformed signal and the digitization interval is constant throughout the dynamic range of the transformed signal.

This invention features an adaptive digitizer circuit for an information processing system. There is an entropy filter responsive to an information signal, V, having a variable noise, $\sigma_V$, that is a function of V, for providing a transformed signal, T, having a constant transformed noise level, $\sigma_T$, throughout its dynamic range.

In a preferred embodiment, there is an analog to digital converter in which the ratio $\sigma_T/\delta_T$ of the noise level $\sigma_T$ of the transformed signal and the digitization interval $\delta_T$ is constant throughout the dynamic range of T.

T may be defined as $$T(V) = \int_0^V \frac{\eta}{\sigma_V(V)} dV + C$$

where C is an arbitrary constant.

The system may be an image processing system. The variable noise level, $\sigma_V$, may include constant electronic noise, $\sigma_e$, and variable photon noise $\sigma_\gamma$, for providing a transformed signal having a constant transformed noise level throughout its dynamic range. The entropy filter may also include a first transform circuit having a first transform function $T_1$ from zero to the crossover of $\sigma_e$ and $\sigma_\gamma$, and a second transform circuit having a second transform function $T_2$ above that crossover.

The first transform circuit may provide a first transform function $$T_1(V) = \frac{\eta S V}{V_{FS}} + \frac{\eta V_{FS}}{\alpha S}$$

with a slope of $\eta S/V_{FS}$, from zero to the crossover of $\sigma_e$ and $\sigma_\gamma$, and the second transform circuit may have a transform function $$T_2(V) = \frac{2\eta \sqrt{V}}{\sqrt{\alpha}}$$

above that crossover. The first transform circuit may include amplifier means for providing at its output the first transform function. The second transform circuit may include control circuit means for modifying the slope of the output of the amplifier means to provide the second transform function. The amplifier means may include a number of amplifier stages, and the control circuit may include a number of voltage-sensitive conducting means for successively increasing their conduction and decreasing their associated amplifier stage output in response to increases in the information signal, V.

DISCLOSURE OF PREFERRED EMBODIMENT

Other objects, features and advantages will occur from the following description of a preferred embodiment and the accompanying drawings, in which.

Figure 1:
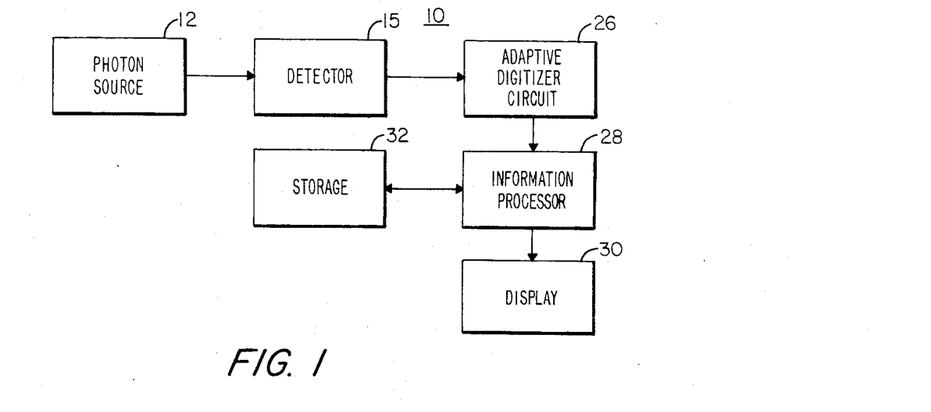
FIG. 1 is a block diagram of an information processing system using an adaptive digitizer circuit according to this invention.

There is shown in FIG. 1 an information processing system 10 having source 12 which represents a source producing a low number of photons, such as available from X-ray systems and night imaging systems or cosmic radiation. The photons are sensed by detector 15, whose output is delivered to adaptive digitizer circuit 26 according to this invention. The digitized output is thereafter fed to an information processor 28 whose output may be immediately provided to display 30. Storage 32 may be used to replay or reprocess data at a subsequent time. In more general applications the adaptive digitizer circuit 26 is not restricted to image processing but is applicable generally to information processing.

Figure 2:
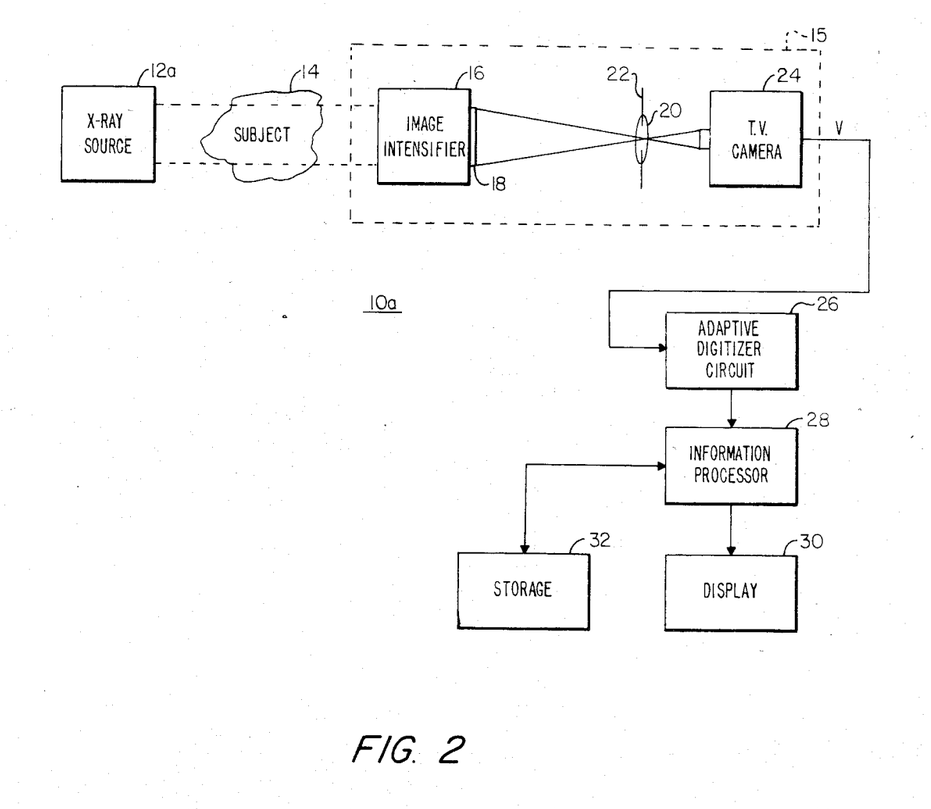
FIG. 2 is a more detailed block diagram of a system similar to that of FIG. 1 adapted for use in an X-ray imaging system.

One form of image processing to which the adaptive digitizer circuit of this invention is applicable is shown in more detail in FIG. 2 in the form of an X-ray machine having an X-ray source 12a whose X-ray output passes through and is partially absorbed by a subject 14 and is detected in detector 15 by image intensifier 16, which converts the received X-rays into visible light at an output screen 18. In FIG. 2 and subsequent figures, like parts have been given like reference numbers and similar parts have been given like reference numbers accompanied by a lower case letter. Screen 18, also in detector 15, is scanned in the normal way through an optical system 20 and aperture 22 by a video camera 24. The analog output of video camera 24 is delivered to the adaptive digitizer circuit 26 according to this invention. The digitized output is thereafter fed to an image processor 28 whose output may be immediately provided to display 30. Storage 32 may be used to replay or reprocess data at a subsequent time. An understanding of the basic operation of system 10 will aid in understanding of the invention. The X-rays from source 12 are composed of a number of photons. The average number of photons leaving the X-ray source and traveling along a path, to become eventually a pixel of the image, are attenuated by subject 14 according to the formula $$Ne^{-\mu} \tag{1}$$

where $\mu$ is the attenuation factor or coefficient of absorption related to the specific path and N is the original number of photons per pixel. The voltage out of video camera 24 is then expressed as $$V = \alpha N e^{-\mu} \tag{2}$$

where $\alpha$ is the constant of proportionality at the interface between the input of the image intensifier 16 and the output of the video camera 24, and is proportional to the aperture 22. $Ne^{-\mu}$ is not an actual count, but an average value. If one took samples of a number of photons $Ne^{-\mu}$ striking a single pixel in image intensifier 16 over a period of time, the number would vary. This noise, or standard deviation, is inherent in the operation of the X-ray source and is expressed as $$\sigma_\gamma = \sqrt{Ne^{-\mu}} \tag{3}$$

The electronics associated with video camera 24 also introduce noise, which may be expressed as $\sigma_e$ equal in first approximation to the ratio of the full scale voltage, $V_{FS}$, of the video camera divided by the signal-to-noise ratio, or:

$$\sigma_e = \frac{V_{FS}}{S} \tag{4}$$

Thus the total noise at the output of video camera 24 is $\sigma_V$, which may be expressed as $$\sigma_V^2 = \left(\frac{V_{FS}}{S}\right)^2 + (\alpha \sigma_\gamma)^2 \tag{5}$$

or simply $$\sigma_V = \sqrt{\alpha^2 Ne^{-\mu} + \alpha^2 N^2/S^2} \tag{6}$$

or $$\sigma_V = \sqrt{\alpha V + V_{FS}^2/S^2} \tag{7}$$

Figure 3:
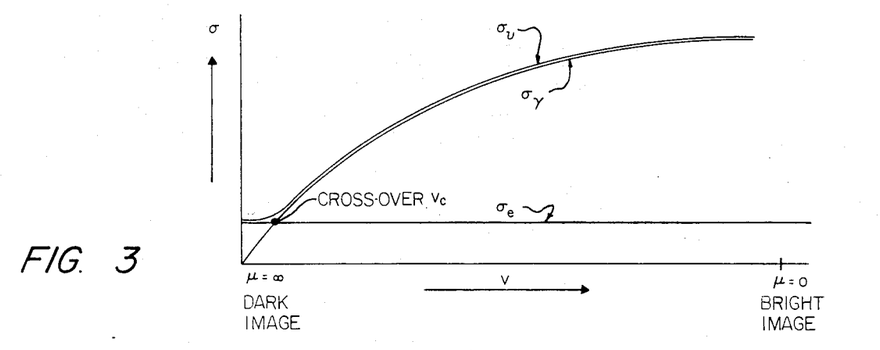
FIG. 3 is an illustration of the variation of the inherent noise as a combination of the photon noise and the electronic nose as a function of the intensity of the analog signal.

The variation of the noise with respect to the video output voltage V is shown in FIG. 3. There, the electronic noise associated with video camera 24 is practically constant, $\sigma_e$, throughout the dynamic range of the video signal. In contrast, the photon X-ray noise, $\sigma_\gamma$, increases with increases in video signal throughout the dynamic range. Thus the combined or inherent noise $\sigma_V$ is essentially constant below the crossover point $V_c$, where the two noise curves, $\sigma_e$ and $\sigma_\gamma$, cross. Beyond that point the inherent or combined noise $\sigma_V$ increases with increasing V, and very soon is practically equal to $\sigma_\gamma$.

In digitization, the digital interval, $\delta$, is inversely proportional to the number of codes used in the digitization. The smaller the digitizing interval, the greater the number of codes required. For any given voltage, the number of codes multiplied by the digitizing interval is equal to the full voltage, or $$V_{Full\ Scale} = \text{Number of Codes } (N_c) \times \text{Digitization Interval } (\delta) \quad (8)$$

Digitization also adds some error, which can be dealt with in terms of an equivalent digitization noise, having an RMS value $\sigma_\delta$ expressed as:

$$\sigma_\delta = \delta/\sqrt{12} \quad (9)$$

Thus the overall noise, i.e. the combined or inherent noise further combined with the equivalent digitization noise, associated with the video signal after digitization, $\sigma_V^*$, may be expressed as $$\sigma_V^* = \sqrt{\sigma_V^2 + \frac{\delta^2}{12}} \quad (10)$$

or $$\sigma_V^*/\sigma_V = \sqrt{1 + \frac{\delta^2}{\sigma_V^2 12}} \quad (11)$$

If then the ratio of the noise $\sigma_V$ to the digizitation interval, $\delta$, is designated by $\eta$, $$\sigma_V/\delta = \eta \quad (12)$$

which may also be written $$\sigma_V = \eta\delta \quad (13)$$

then equation (11) may be further expressed as $$\frac{\sigma_V^*}{\sigma_V} = \sqrt{1 + \frac{1}{\eta^2 12}} \quad (14)$$

For example, with $\eta$ equal to 1, then $\sigma_V^*/\sigma_V$ is equal to 1.04, representing a four percent increase in noise. When $\eta$ is equal to 2, then $\sigma_V^*/\sigma_V$ is equal to 1.01, representing a one percent increase in noise. It can now be perceived that there is a balance between the digitization interval, $\delta$, and the noise, $\sigma_V$. When $\eta$ is below 1, the digitization interval, $\delta$, is larger than $\sigma_V$. When $\eta$ is above 1, the digitization interval, $\delta$, is smaller than $\sigma_V$. Depending upon the structure of the image, satisfactory digitization occurs when $\eta$ is larger than a value ranging between 0.5 and 0.8. Digitization is excellent at $\eta$ in excess of 1. In other terms, when $\eta$ is equal to or greater than 1 the digitization noise is negligible compared to the inherent noise of the analog signal.

Figure 4:
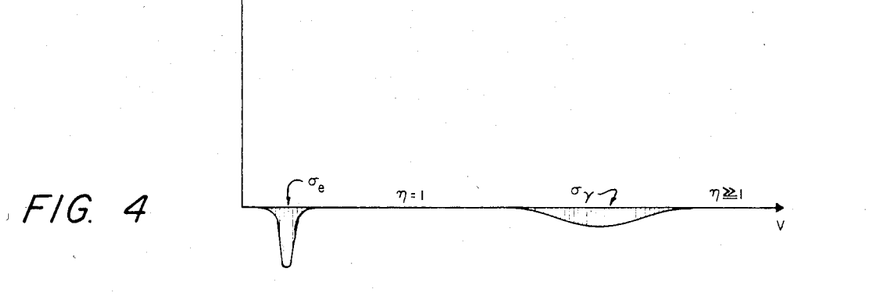
FIG. 4 is an illustration showing the variation in with respect to the T.V. camera output when the signal is directly digitized with a linear A/D converter.

As illustrated in FIG. 4, if the digitization interval for the smaller noise, practically equal to $\sigma_e$, is set with $\eta$ equal to 1, then at the larger noise, practically equal to $\sigma_\gamma$, the interval will be much greater. This will result in the fact that at larger noise value the signal is over-digitized, thus increasing the overall number of codes needed and the cost of subsequent processing equipment in the system. If, in contrast, $\eta$ is set to a value not over-digitizing the signal at high noise value, then the smaller noise portion of the signal will have $\eta$ equal to an unacceptably low value so that information will be lost in this area.

An example illustrates the problem. Assume that in the expression $\sigma_e = V_{FS}/S$ the value of S, the signal to noise ratio, is 4,000. Suppose in addition that we want $\eta$ to be equal to or greater than 1. We know that $$V = \alpha N e^{-\mu} \quad (15)$$

We also know that $$V_{FS} = \alpha N \quad (16)$$

It is also known that $$V = N_{code} \times \delta \quad (17)$$

that $$\alpha N = N_{code} \times \delta \quad (18)$$

and that $$\sigma_V = \eta\delta \quad (19)$$

or $$\sigma_V/\delta = \eta \quad (20)$$

Therefore, $$\alpha N = N_{code} \sigma_e/\eta \quad (21)$$

From this it follows that $$\alpha N = N_{code}\delta = N_{code}\delta V(\min)/\eta = N_{code}\sigma_e/\eta \quad (22)$$

Since N is equal to or greater than 1, then $$\alpha N = N_{code}\alpha N/S\eta \quad (23)$$

and $$\eta S = N_{code} \quad (24)$$

from which it follows that $$N_{code} = 1 \times 4,000 \quad (25)$$

since $$\text{Number of Bits} = \log_2 N_{code} \quad (26)$$

and $\log_2 4,000 = 12$, it becomes clear that a twelve-bit A/D converter would be needed to convert the analog video signal into a digital signal in the normal order of things. Thus in the conventional manner, a twelve-bit A/D converter would be required, even though in most of the range of the signal such a number of bits would be unnecessary and would increase the entropy of the data well above their information content and consequently reduce the ability for efficient data compression.

Figure 5:
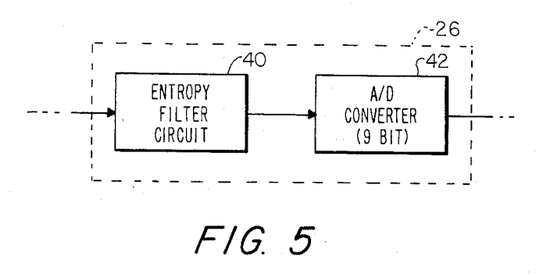
FIG. 5 is a more detailed block diagram of the adaptive digitizer circuit of FIG. 1.

It is a realization of this invention that the number of bits required could be substantially reduced if a proper monotonic transformation is applied to the analog signal, such that modified inherent noise of the transformed signal could be made constant throughout its dynamic range. Let us name T the transform of V, and $\sigma_T$ the RMS associated noise. As illustrated in FIG. 5, this invention accomplishes that by using an analog circuit which can be envisioned as an entropy filter. Thus the adaptive digitizer 26 according to this invention includes an entropy filter circuit 40 which provides such a transform function and enables the use of a simple nine-bit A/D converter 42, in which the ratio $\sigma_T/\delta_T$ of the noise level $\sigma_T$ of the transformed signal and the digitization interval, $\delta_T$, is constant throughout the range of T.

Figure 6:
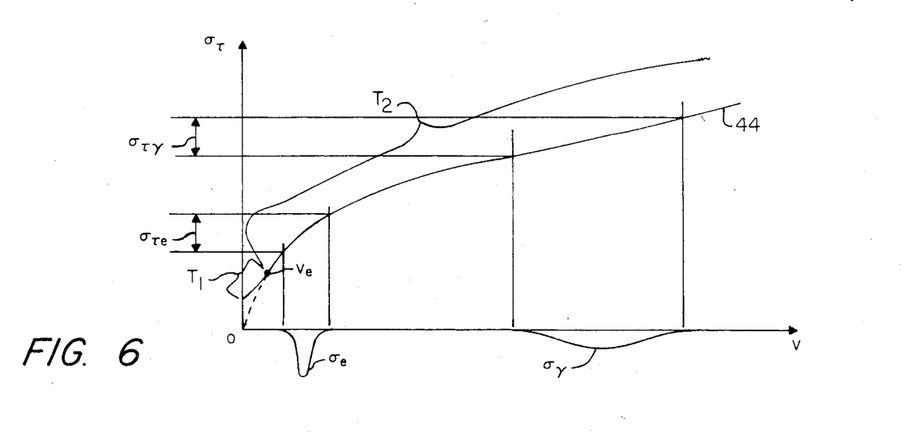
FIG. 6 is an illustration of the transform function generated by the entropy filter of this invention which provides a constant noise level throughout the dynamic range of the T.V. camera output.

This transform function 44 is illustrated in FIG. 6 as including two parts. The first part $T_1$, is generally linear up to the crossover point $V_C$, and is defined as $$T_1(V) = \frac{\eta S V}{V_{FS}} + \frac{\eta V_{FS}}{\alpha S} \tag{27}$$

and has a slope of $\eta S/V_{FS}$. The second part $T_2$ of transfer function 44 is equal to $$T_2(V) = \frac{2\eta \sqrt{V}}{\sqrt{\alpha}} \tag{28}$$

The function is such that the inherent noise of V is transformed into a constant noise $\sigma_T$.

In a more general case, given a signal V and its intrinsic noise, having a RMS value $\sigma_V$, which is a function of V, a transformation of V, T(V), having a constant noise thorughout its dynamic range, is given by $$T(V) = \int_0^V \frac{\eta}{\sigma_V(V)} dV + C \tag{29}$$

with C an arbitrary constant.

The intrinsic noise of the signal V of a digital X-ray system approximately shows the following behavior:

In the region $T_1$ in which the electronic noise is predominant, $$\sigma_{V1} \cong \frac{V_{FS}}{S} \tag{30}$$

In the region $T_2$ in which the photon noise is predominant, $$\sigma_{V2} \cong \alpha \sqrt{Ne^{-\mu}} = \sqrt{\alpha V} \tag{31}$$

By combining the relationships (29) and (30), we can derive the transformation $T_1(V)$:

$$T_1(V) = \int_0^V \frac{\eta S}{V_{FS}} dV + C_1 = \frac{\eta S V}{V_{FS}} + C_1 \tag{30}$$

By combining the relationships (29) and (31), we can derive the transformation $T_2(V)$:

$$T_2(V) = \int_0^V \frac{\eta}{\sqrt{\alpha V}} dV + C_2 = \frac{2\eta \sqrt{V}}{\sqrt{\alpha}} + C_2 \tag{33}$$

The electronic noise and the photon noise are equal at $V_C$, which can be expressed as a function of S, $V_{FS}$, and $\alpha$, by the equality condition:

$$\frac{V_{FS}}{S} = \sqrt{\alpha V_C} \longrightarrow V_C = \frac{V_{FS}^2}{\alpha S^2} \tag{34}$$

At $V_C$, the derivatives of $T_1(V)$ and $T_2(V)$ must be equal. In fact:

$$\frac{dT_1(V_C)}{dV} = \frac{S}{V_{FS}} \tag{35}$$

$$\frac{dT_2(V_C)}{dV} = \frac{\eta}{\sqrt{\alpha V_C}} = \frac{\eta}{\sqrt{\alpha \frac{V_{FS}^2}{S^2}}} = \frac{\eta S}{V_{FS}} \tag{36}$$

In order to have an overall transformation T(V) of V, which does not have any discontinuity at $V_C$, a proper relation must be established between the two arbitrary constants $C_1$ and $C_2$.

That is, we must have at $V_C$:

$$\frac{\eta S V_{CR}}{V_{FS}} + C_1 = \frac{2\eta \sqrt{V_{CR}}}{\sqrt{\alpha}} + C_2 \tag{37}$$

That is, by using the relationship (34), $$\frac{\eta V_{FS}}{\alpha S} + C_1 = \frac{2\eta V_{FS}}{\alpha S} + C_2 \tag{38}$$

Now we can arbitrarily set $C_2 = 0$ and the overall transform function for the specific case becomes:

$$T(V) = \begin{cases} \text{FOR } V < V_C \; T_1(V) = \frac{\eta S V}{V_{FS}} + \frac{\eta V_{FS}}{\alpha S} & (39) \\ \text{FOR } V > V_C \; T_2(V) = \frac{2\eta \sqrt{V}}{\sqrt{\alpha}} & (40) \end{cases}$$

which is the transform function implemented in the disclosed adaptive A/D converter embodiment.

Figure 7:
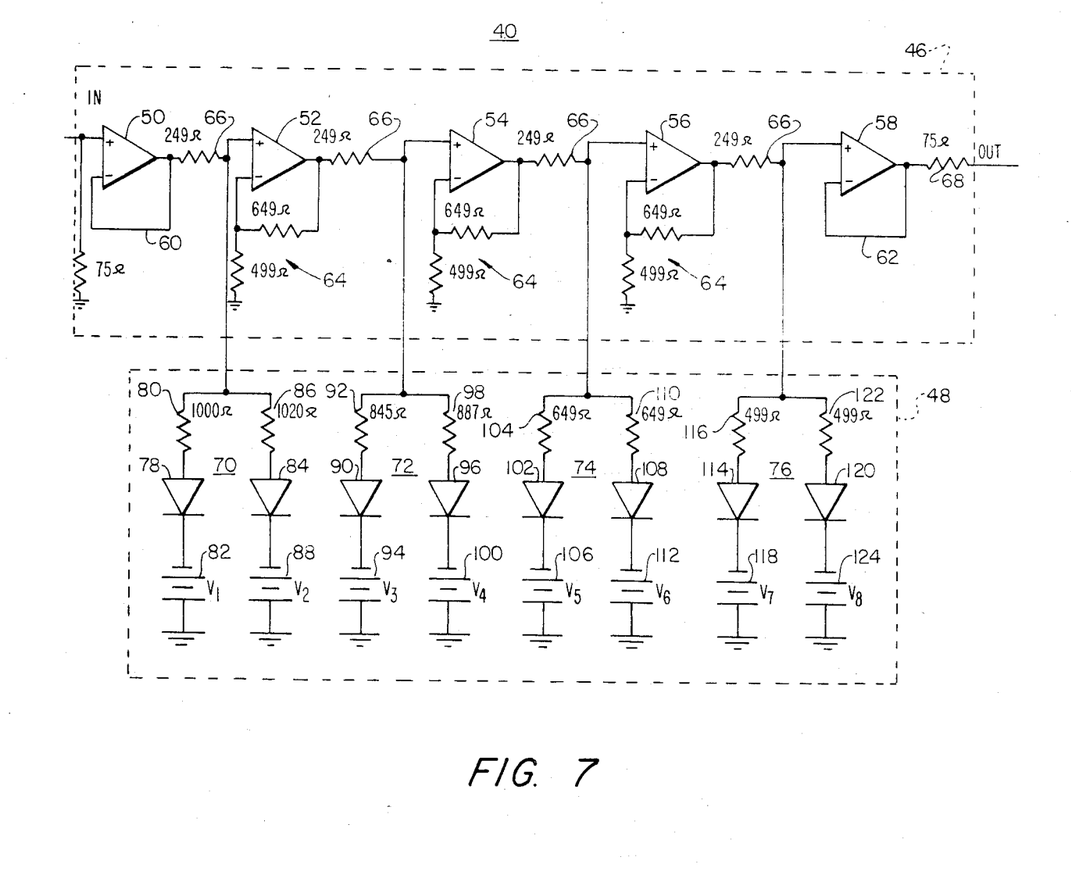
FIG. 7 is a detailed schematic diagram of the entropy filter circuit of FIG. 5.

In a preferred embodiment for a system operating with low numbers of photons, entropy filter circuit 40, FIG. 7, may include a transform circuit 46 for providing the portion $T_1$ of transfer function 44, and circuit 48 for providing the portion $T_2$ of transfer function 44. Circuit 46 includes five operational amplifiers 50, 52, 54, 56 and 58, which may be HA2540's of Harris Semiconductor, Melbourne, Fla. The outputs of amplifiers 50 and 58 are directly connected to their own negative inputs by lines 60 and 62. The outputs of amplifiers 52, 54 and 56 are fed back to their own negative inputs by identical voltage divider networks 64, each of which includes a pair of resistors, one of 649 ohms and one of 499 ohms. The outputs of amplifiers 50, 52, 54 and 56 are interconnected with the positive inputs of the next succeeding amplifier by a 249 ohm resistor. The output of amplifier 58 is delivered through a 75-ohm resistor 68. Circuit 48 includes four diode controlled circuits 70, 72, 74, and 76.

Diode control circuit 70 includes diode 78, a 1000 ohm resistor 80, and bias supply 82 having the voltage $V_1$ of $-75$ millivolts in parallel with second diode 84 and its associated 1020 ohm resistor 86 and bias supply 88 providing a bias voltage $V_2$ of $-86$ millivolts. Diode control circuit 72 includes diode 90 in series with 845 ohm resistor 92 and bias supply 94, having a voltage $V_3$ of $+255$ millivolts, in parallel with diode 96, 887 ohm resistor 98, and bias supply 100, providing a bias voltage $V_4$ of $+50$ millivolts. Diode control circuit 74 includes diode 102 in series with 649 ohm resistor 104 and bias supply 106, which provides a bias voltage $V_5$ of 157 millivolts, in parallel with diode 108, 649 ohm resistor 110, and bias supply 112, which provides a voltage $V_6$ of $+124$ millivolts. The resistance 104, like the resistance 110, is 649 ohms. Diode control circuit 76 includes diode 114 in series with 499-ohm resistor 116 and bias supply 118, which provides a bias voltage $V_7$ of 390 millivolts in parallel with diode 120, 499 ohm resistance 122, and bias supply 124 providing a bias voltage $V_8$ of 275 millivolts.

In operation, in the lower voltage range the series of amplifiers 50-58 provide the $T_1$ portion of the transfer function, where $$T_1(V) = \frac{\eta SV}{V_{FS}} + \frac{\eta V_{FS}}{\alpha S} \quad (27)$$

with the slope being maintained at $\eta S/V_{FS}$. As the voltage increases, the various diodes in the control diode circuits 70–76 switch on and reduce the gain to shallow out the slope and provide the second portion $T_2$ of the transfer function 44, which is defined as $$T_2(V) = \frac{2\eta \sqrt{V}}{\sqrt{\alpha}} \quad (28)$$

For example, as the voltage climbs sufficiently, the output of amplifier 56 will provide the necessary 0.975 volts, which is equal to the approximately 0.7 forward bias of the voltage plus the 275 millivolt $V_8$ bias on diode 120. When this occurs, diode 120 conducts and the output gain is reduced so that the slope of the curve starts to decrease. Subsequently, when the voltage increases further so that the voltage across diode 114 reaches 1.09 volts, the combination of 0.7 volts plus 390 millivolt $V_7$ bias, this diode too conducts. With both of them conducting, the attenuation is cut roughly in half, from 499 ohms to 249 ohms. This resistance, in connection with the 249-ohm resistor 266 at the output of amplifier 56, provides a voltage divider which reduces the gain by a factor of two. Since the gain of amplifier 56 was originally 2.3, it is now reduced to 1.15, and the second step of the slope reduction is accomplished. The same sequence occurs with respect to control diode circuits 74, 72 and 70. In circuit 74 the reduction factor is 1.77 and the gain is reduced to only 1.3. In control diode circuit 72 the reduction factor is 1.58 and the gain is reduced only to 1.45, and in control diode circuit 70 the reduction factor is 1.49 and the gain is reduced to only 1.54. In this manner, the transfer characteristic 44 is constructed smoothly in segments, to meet the defined curve of $$T_2(V) = \frac{2\eta \sqrt{V}}{\sqrt{\alpha}} \quad (28)$$

The number of amplifiers and diodes is not limited to the number shown in FIG. 7, but may be chosen conveniently to provide the total number of steps desired for the construction of the transfer characteristic. In addition, the construction of the transfer characteristic need not be done using the specific type of amplifier and diode circuit shown. A number of other circuits could also be used. For example, a level-sensing circuit could be used to monitor the voltage and selectively switch the proper attenuators or to change the gain of amplifiers to obtain the proper transfer characteristic.

Utilizing this invention, the number of bits required in A/D converter 42 is reduced to no more than nine. This is shown as follows. It is known that $$N_{code}\delta_T = \sqrt{\alpha N} \quad (41)$$

where $\delta_T$ is the new digitization interval used to digitize the function T, $$\sigma_T \cong \frac{dT}{dV} \sigma_V = \frac{\sqrt{\alpha}}{2} \quad (42)$$

and $$\sigma_T = \eta \delta_T \quad (43)$$

From this it follows that $$N_{code} \frac{\sigma_T}{\eta} = N_{code} \frac{\sqrt{\alpha}}{2\eta} = \sqrt{\alpha N} \quad (44)$$

Then $$N_{code} = 2\eta \sqrt{N} \quad (45)$$

Once again, we know that $$\text{Number Bits} = \log_2 2\eta \sqrt{N} \quad (46)$$

Therefore, when N=40,000 photons the number of bits, B, may be expressed as:

$$B = \log_2 2\eta \sqrt{40,000} \quad (47)$$

where, when $\eta = 1$, $$B = \log_2 2 \times 1 \times 200 \quad (48)$$

or $$B = \log_2 400 \quad (49)$$

and thus $$B = 8.7 \quad (50)$$

Thus, the required number of bits has been reduced from twelve to nine, and this substantially reduces the size and the attendant expense of all of the subsequent necessary information processing equipment. In addition, this technique avoids overcoding of information, which increases the entropy of the data above their information content. Since this is so, the data compression effected using data coded according to this invention can be much more efficient. For example, under certain typical circumstances, the nine-bit data can be compressed to three or four bits, whereas the typical twelve-bit data could only be reduced to approximately six bits.

Other embodiments will occur to those skilled in the art and are within the following claims:

What is claimed is:

1. An adaptive digitizer circuit for an information processing system comprising:
    an entropy filter, responsive to an information signal, V, having a variable noise, $\sigma_V$, that is a function of V, for providing a transformed signal, T, having a constant transformed noise level, $\sigma_T$, throughout its dynamic range; and
    an analog to digital converter responsive to the transformed signal from said entropy filter and in which the ratio, $\sigma_T/\delta_T$, of the noise level, $\sigma_T$, of the transformed signal and the digitization interval, $\delta_T$, is constant throughout the dynamic range of T.

2. The adaptive digitizer circuit of claim 1 further including an analog to digital converter in which the ratio, $\sigma_T/\delta_T$, of the noise level, $\sigma_T$, of the transformed signal and the digitization interval, $\delta_T$, is constant throughout the dynamic range of T.

3. The adaptive digitizer circuit of claim 1 in which said entropy filter provides the transform $$T(V) = \int_0^V \frac{\eta}{\sigma_V(V)} dV + C$$

4. The adaptive digitizer circuit of claim 1 in which said variable noise level, $\sigma_V$, includes constant electronic noise, $\sigma_e$, and variable photon noise, $\sigma_\gamma$, for providing a transformed signal having a constant transformed noise level throughout its dynamic range.

5. The adaptive digitizer circuit of claim 4 in which said entropy filter includes a first transform circuit having a first transform function $T_1$ from zero to the crossover of $\sigma_e$ and $\sigma_\gamma$, and a second transform circuit having a second transform function $T_2$ above that crossover.

6. The adaptive digitizer circuit of claim 1 in which said first transform circuit includes amplifier means for providing at its output said first transform function.

7. The adaptive digitizer circuit of claim 6 in which said second transform circuit includes control circuit means for modifying the slope of the output of said amplifier means to provide said second transform function.

8. The adaptive digitizer circuit of claim 7 in which said amplifier means includes a number of amplifier stages and said control circuit includes a number of voltage sensitive conduction means for successively increasing their conduction and decreasing their associated amplifier stage output in response to increases in the information signal, V.

9. An adaptive digitizer circuit for an information processing system comprising:
    an entropy filter, responsive to an information signal, V, having a variable noise level, $\sigma_V$, including constant electronic noise, $\sigma_e$, and variable photon noise, $\sigma_\gamma$, for providing a transformed signal having a constant transformed noise level throughout its dynamic range; said entropy filter including a first transform circuit having a first transform function $T_1$ from zero to the crossover of $\sigma_e$ and $\sigma_\gamma$, and a second transform circuit having a second transform function $T_2$ above that crossover; and
    an analog to digital converter responsive to the transformed signal from said entropy filter and in which the ratio $\sigma_T/\delta_T$ of the noise level, $\sigma_T$, of the transformed signal and the digitization interval, $\delta_T$, is constant.

10. An adaptive digitizer circuit for an image processing system comprising:
    an entropy filter, responsive to an image signal, V, having a variable noise level, $\sigma_V$, including constant electronic noise, $\sigma_e$, and variable inherent noise, $\sigma_\gamma$, for providing an output signal having a constant noise level throughout the dynamic range of the image signal; said entropy filter including a first transform circuit having a first transform function $T_1$ from zero to the crossover of $\sigma_e$ and $\sigma_\gamma$, and a second transform circuit having a second transform function $T_2$ above that crossover; and
    an analog to digital converter responsive to the output signal from said entropy filter and in which the ratio $\sigma_T/\delta_T$ of the noise level, $\sigma_T$, of the transformed signal and the digitization interval, $\delta_T$, is constant.

11. An adaptive digitizer circuit for an information processing system comprising:
    an entropy filter, responsive to an information signal, V, having a variable noise level, $\sigma_V$, including constant electronic noise, $\sigma_e$, and variable inherent noise, $\sigma_\gamma$, for providing an output signal having a constant noise level throughout the dynamic range of the information signal; said entropy filter including a first transform circuit having a first transform function $$T_1(V) = \frac{\eta S V}{V_{FS}} + \frac{\eta V_{FS}}{\alpha S}$$

and a slope of $\eta S/V_{FS}$ from zero to the crossover of $\sigma_e$ and $\sigma_\gamma$ and a second transform circuit having a second transform function $$T_2(V) = \frac{2\eta \sqrt{V}}{\sqrt{\alpha}}$$

above that crossover; and
    an analog to digital converter responsive to the output signal from said entropy filter and in which the ratio $\sigma_T/\delta_T$ of the noise level, $\sigma_T$, of the transformed signal and the digitization interval, $\delta_T$, is constant.

12. An adaptive digitizer circuit for an image processing system comprising:
    an entropy filter, responsive to an image signal, V, having a variable noise level, $\sigma_V$, including constant electronic noise, $\sigma_e$, and variable inherent noise, $\sigma_\gamma$, for providing an output signal having a constant noise level throughout the dynamic range of the image signal; said entropy filter including a first transform circuit having a first transform function $$T_1(V) = \frac{\eta SV}{V_{FS}} + \frac{\eta V_{FS}}{\alpha S}$$

and a slope of $\eta S/V_{FS}$ from zero to the crossover of $\sigma_e$ and $\sigma_\gamma$, and a second transform circuit having a second transform function $$T_2(V) = \frac{2\eta \sqrt{V}}{\sqrt{\alpha}}$$

above that crossover; and an analog to digital converter responsive to the output signal from said entropy filter and in which the ratio $\sigma_T/\delta_T$ of the noise level, $\sigma_T$, of the transformed signal and the digitization interval, $\delta_T$, is constant.

* * * * *